United States Patent [19]
Bedwell

[11] 4,179,664
[45] Dec. 18, 1979

[54] CONSTANT FRACTION SIGNAL SHAPING APPARATUS
[75] Inventor: Michael O. Bedwell, Concord, Tenn.
[73] Assignee: Ortec Incorporated, Oak Ridge, Tenn.
[21] Appl. No.: 819,211
[22] Filed: Jul. 26, 1977
[51] Int. Cl.$^2$ ............................................. H03K 5/153
[52] U.S. Cl. .................................... 328/150; 328/117; 307/232; 307/358
[58] Field of Search ................. 307/232, 261, 358; 333/20; 328/65, 109, 110, 112, 114, 117, 132, 108, 150

[56] References Cited
U.S. PATENT DOCUMENTS 3,532,905  10/1970  Zijta et al. .................. 307/358 X
3,676,783  7/1972  Kinbara et al. ............... 307/358 X Primary Examiner—John Zazworsky
Attorney, Agent, or Firm—Finnegan, Henderson, Farabow & Garrett

[57] ABSTRACT

A trigger pulse, derived for instance from a radiation detector, is applied to an input circuit which splits the pulse into two components. The respective component signals are acted on by two characteristic circuits, one of which attenuates the first signal component and the other of which delays the second signal component. The respective attenuated signal and delayed signal are applied to a passive element, such as a differential transformer to invert one component with respect to the other and to sum the resulting signals. The output signal of the differential transformer is a constant-fraction bipolar timing signal which is accurately correlated with the time of occurrence of the event identified with the trigger pulse.

5 Claims, 13 Drawing Figures

CONSTANT FRACTION SIGNAL SHAPING APPARATUS

BACKGROUND OF THE INVENTION

The present invention relates to a circuit used in time spectroscopy, which is the measurement of the time relationship between the occurrence of two nuclear events. The present invention is particularly related to a circuit which utilizes passive circuit components only.

In the measurement of the time relationship between the occurrence of two nuclear events, it is known to be extremely difficult to obtain a precise and accurate signal indicative of the occurrence of each event. For instance, the pulses derived from a radiation detector may be different in wave shape and amplitude depending upon the type of radiation particle detected, the characteristics of the detector and other factors unique to the measurement process. The signal resulting from the appropriate amplification of the pulse from the detector is used to trigger a circuit for generating a logic signal to establish the time of occurrence of each event. Ideally, the timing of the logic pulse should be insensitive to the shape and to the amplitude of the trigger pulse.

One method used in the prior art is known as the constant-fraction method. Because the timing of events is important in scintillator/photomultiplier systems, a time-pickoff circuit was designed that would trigger an output signal at the same fraction of the input pulse amplitude, regardless of the total pulse height. The fraction of the pulse height was selected as the one at which the best time resolution could be obtained.

The constant-fraction method is applied to an input signal by delaying the signal and substracting a fraction of the undelayed pulse signal from it. A bipolar pulse is thereby generated, and its zero-crossing is detected and used to produce the output logic pulse. It has been possible to make the zero-crossing time of such a bipolar timing signal insensitive to amplitude and rise time variations of the input signals to the circuit. Consequently, the constant-fraction method is one of the most widely used techniques available in the timing spectroscopy art.

There have been several signal forming techniques used in the prior art typified by the circuits shown respectively in FIGS. 1 and 2. In the circuit of FIG. 1 the constant-fraction signal is formed at a low impedance, forward biased diode junction. This circuit is limited by the bandwidth and dynamic range considerations of the active electronic summing circuitry. A similar method and circuit is shown and described in detail in U.S. Pat. No. 3,818,356.

The circuit of FIG. 2 uses a differential amplifier at the output to perform both the inverting and summing functions. The output signal formed by such a circuit is limited by noise, bandwidth considerations and dynamic range capability of the active elements. A somewhat similar circuit to the device of FIG. 2 is shown and described in U.S. Pat. No. 3,763,436.

The accuracy of a constant-fraction timing circuit is directly related to the quality of the bipolar timing pulse which is formed. The particular circuit to be used to form the constant-fraction bipolar signal should have the following characteristics: (1) the circuit should be relatively free of noise so that the zero-crossing time can be accurately detected; (2) the circuit should not be limited by high-frequency bandwidth considerations so that time jitter and amplitude-dependent time walk of the zero-crossing point can be reduced or avoided; and (3) to reduce amplitude dependent time walk, the circuit should not be limited by dynamic range.

SUMMARY OF THE INVENTION

The present invention overcomes the problems of the prior art by providing a circuit for forming a constant-fraction bipolar timing signal using only passive circuit components. In accordance with the purposes of the invention, as embodied and broadly described herein, the electronic circuit for generating a constant-fraction bipolar signal related in time to the occurrence of an event identified with an input trigger signal comprises means for splitting the signal into a first and a second component, attenuator means applied to the first component of the input signal, delay means applied to the second component of the input singal, and a passive circuit which inverts one component and sums it with the other component of the input signal generating a constant-fraction bipolar timing signal. The output timing signal is accurately correlated with the time of occurrence of the event regardless of the shape and amplitude of the input signal. The passive circuit can for instance be a differential transformer.

DESCRIPTION OF THE PREFERRED EMBODIMENT

Reference will now be made in detail to the preferred embodiment of the invention, examples of which are illustrated in the accompanying drawings.

Figure 1:
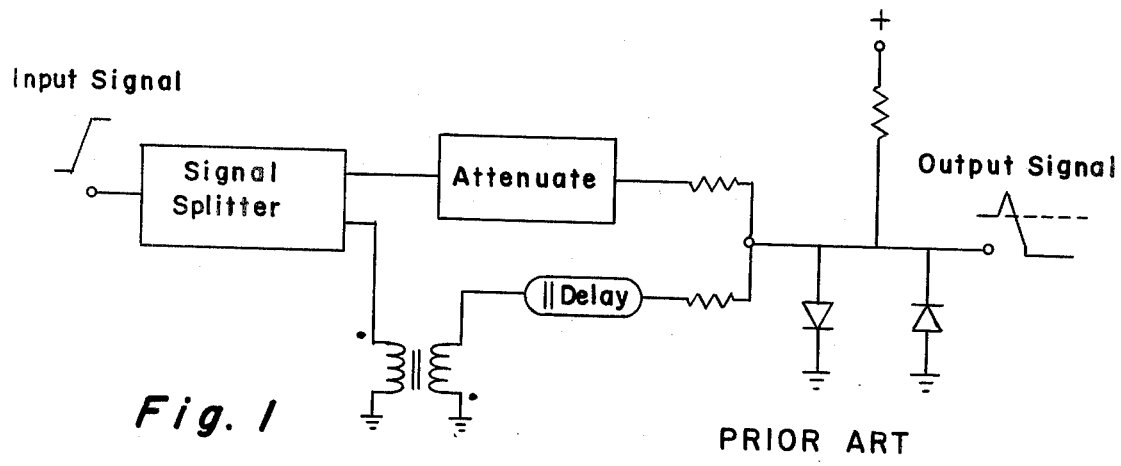
FIG. 1 is a schematic diagram of a prior art circuit.
Figure 2:
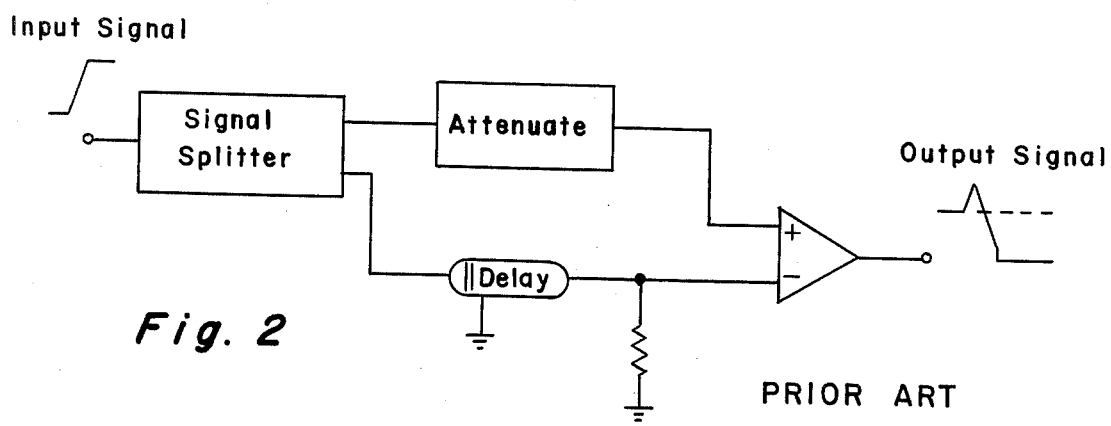
FIG. 2 is a schematic diagram of a prior art circuit.
Figure 3:
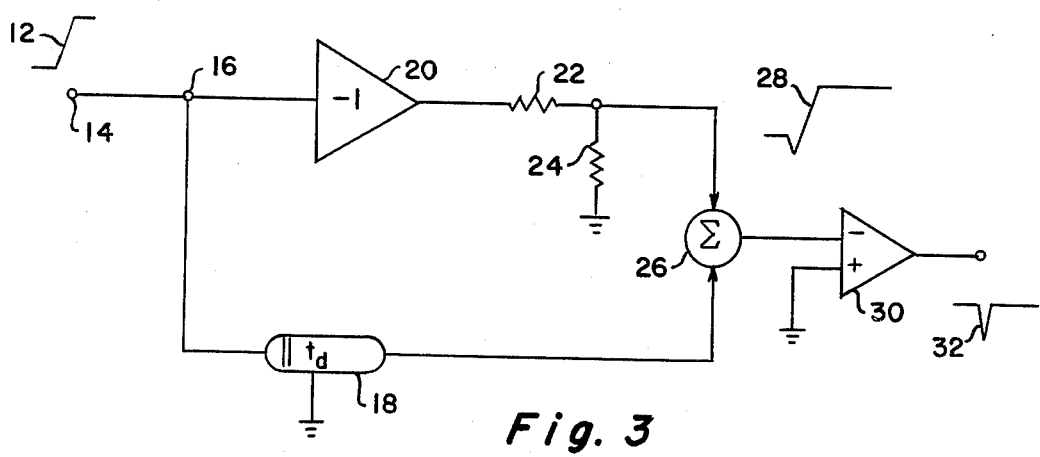
FIG. 3 is a simplified block diagram of the circuitry for forming a constant-fraction bipolar signal.

Referring first to FIG. 3, a simplified block diagram of the circuitry generally used for forming a constant-fraction bipolar signal is shown. A trigger signal, here shown as a piecewise linear function 12, is applied to the input terminal 14 of the circuit. As herein embodied, the input signal 12 is split at junction 16, a component being delayed by element 18 and a second component being inverted by invertor 20 and attenuated by resistances 22 and 24. The resulting components of the input signal are then recombined by summing circuit 26. The resulting output signal is a constant-fraction signal 28.

The constant-fraction signal is applied to the input of a differential discriminator 30 which acts as a zero-crossing detector. The input positive terminal of the differential discriminator 30 is held at a reference potential, here shown as ground. The output of discriminator 30 will therefore be a logic signal having a precise time of occurrence which is independent of the amplitude of the input trigger signal.

Figure 4A:
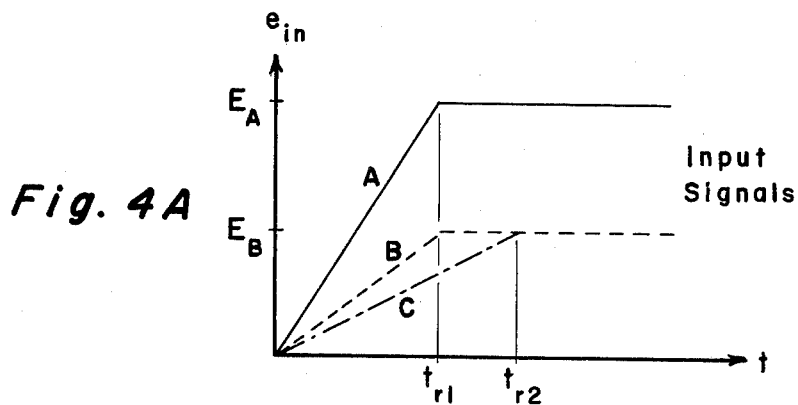
FIGS. 4(A), 4(B) and 4(C) are graphic presentations of the True Constant-Fraction (TCF) method of forming a bipolar signal.
Figure 4B:
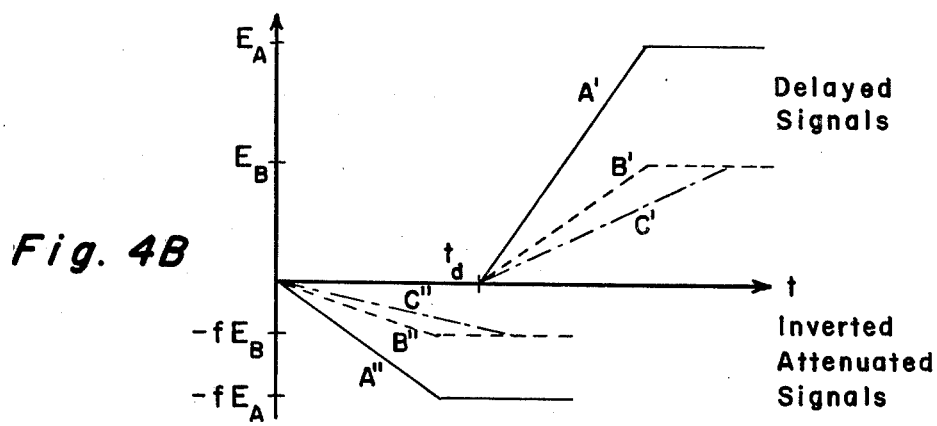
Figure 4C:
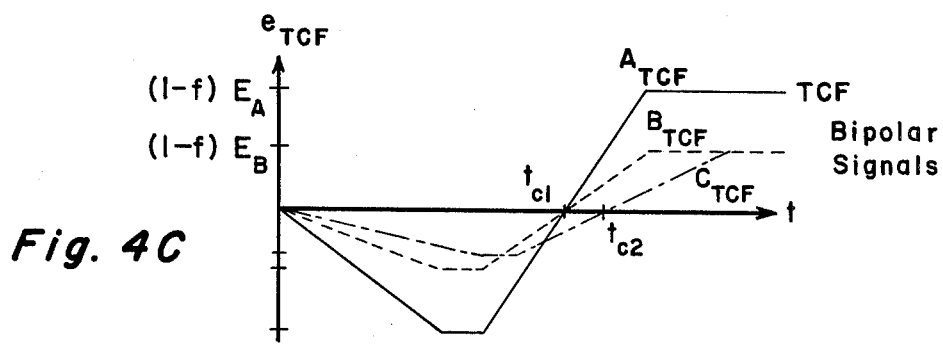

For further understanding of the operation of the circuit shown in FIG. 3 reference is now made to FIGS. 4A, B, C and 5A, B, C. In FIGS. 4(A), 4(B) and 4(C) there is presented a graphic representation of a true constant-fraction (TCF) method of forming an output signal. The TCF method of forming a bipolar signal relies upon the following relationships for linear input signals:

$$t_d > (1-f)t_r$$

$$t_c = t_{TCF} = t_d + ft_r$$

Three separate input signals of differing amplitudes and rise time are plotted against time (t). These signals are separately identified as A, B and C.

In FIG. 4A input signal A has an amplitude of $E_A$ and a rise time of $t_{r1}$. Input signal B has an amplitude of $E_B$ and the same rise time, $t_{r1}$. Input signal C has a total amplitude $E_B$ identical to signal B but a longer rise time of $t_{r2}$.

In FIG. 4B the two components of each input signal which are respectively delayed and inverted/attenuated are shown. The components A', B' and C' of the respective input signals are delayed a time $t_d$. The components A", B" and C" of the respective input signals are inverted and attenuated by a factor "f".

In FIG. 4C the respective signals of FIG. 4B are summed thereby forming true constant-fraction (TCF) bipolar signals corresponding to the respective input signals. As is clearly shown the zero-crossing point is amplitude independent. Thus input signals A and B which both have a rise time $t_{r1}$ are acted upon by the circuit to form bipolar signals having the same zero-crossing point $t_{c1}$. However, the input signal C which has a longer rise time $t_{r2}$ has a different zero-crossing point $t_{c2}$. The zero-crossing point of the signal formed by the true constant-fraction method is consequently not rise time independent.

Figure 5A:
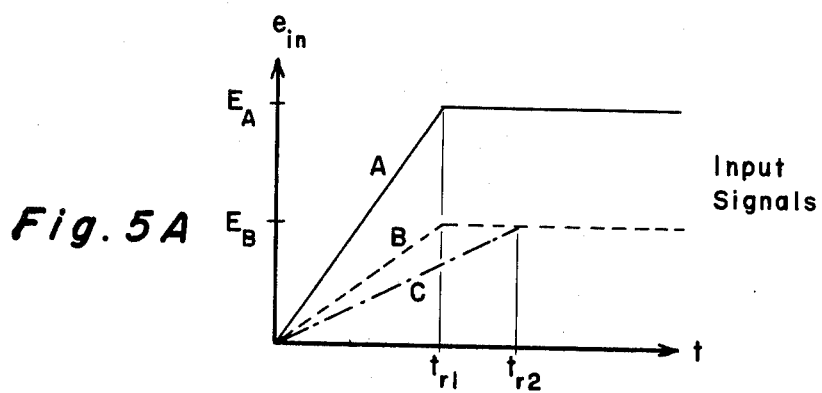
FIGS. 5(A), 5(B) and 5(C) are graphic presentations of the Amplitude and Rise-Time Compensated (ARC) Constant-Fraction method of forming a bipolar signal.
Figure 5B:
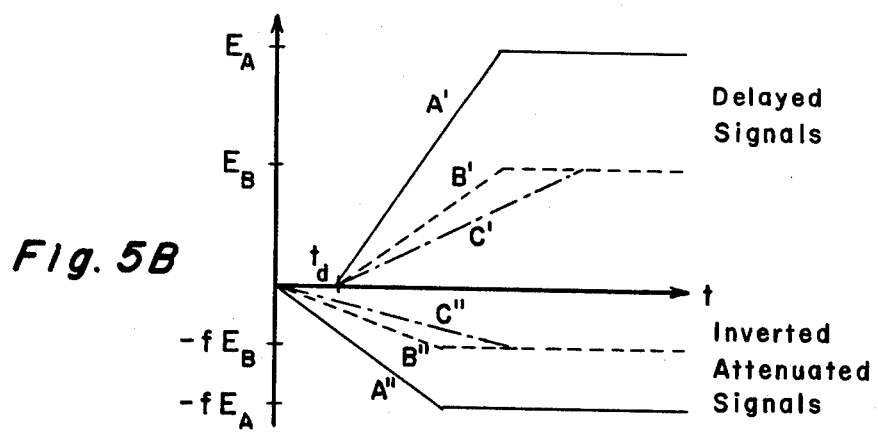
Figure 5C:
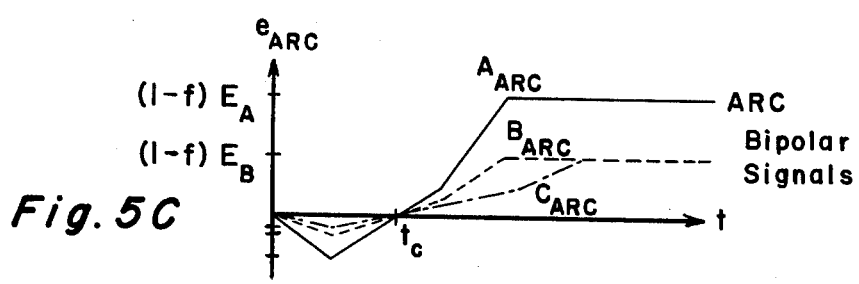

In FIGS. 5A, 5B and 5C a second technique is graphically shown for forming an amplitude and rise time compensated (ARC) constant-fraction bipolar signal. Application of the ARC constant-fraction technique requires the following time relationships for linear input signals:

$$t_d < (1-f)t_r$$

$$t_c = t_{ARC} = t_d/1 - f$$

In FIG. 5A the same input signals A, B and C are shown as before in FIG. 4A.

In FIG. 5B the attenuated/inverted signals A", B" and C" and the delayed signals A', B' and C', are shown as a function of time (t). The delayed signals A', B' and C' are delayed until time $t_d$. The inverted/attenuated signals A", B" and C" are attenuated by a factor "f".

In FIG. 5C the respective delayed signals and inverted/attenuated signals are summed to provide the ARC constant-fraction bipolar signals. Using the ARC constant-fraction method, the zero-crossing point $t_c$ is the same for the signals $A_{ARC}$, $B_{ARC}$ and $C_{ARC}$. Thus the zero-crossing point is independent of both amplitude and rise time of the input signal when using this technique.

Figure 6A:
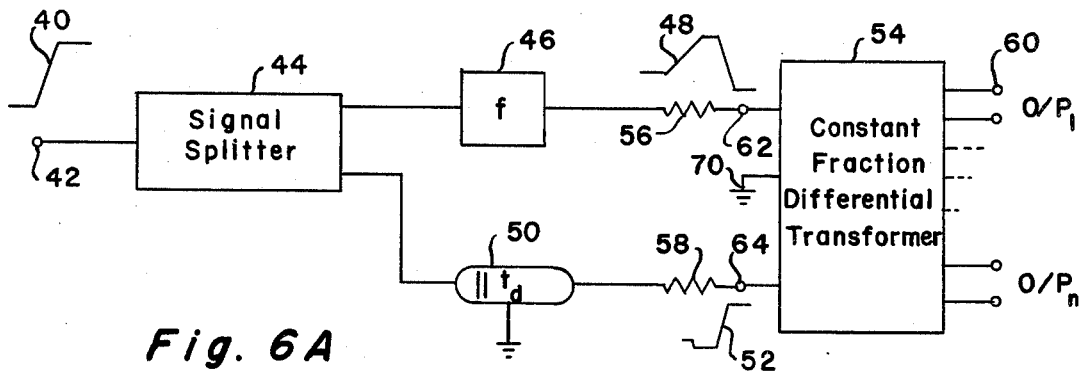
FIGS. 6(A) and 6(B) are schematic circuit diagrams of the preferred embodiment of this invention.
Figure 6B:
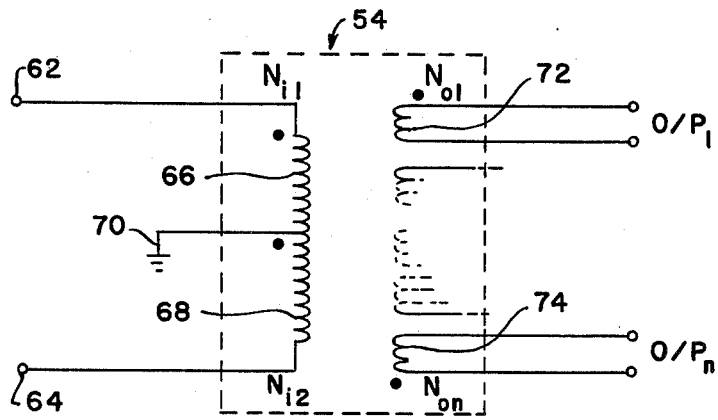
Figure 7A:
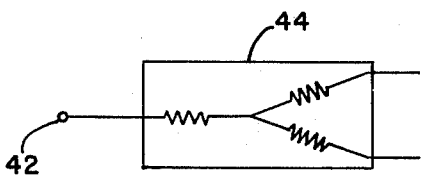
FIGS. 7(A) and 7(B) are respectively resistive $\gamma$ and $\Delta$ networks which can be used as the signal splitter in FIG. 6(A).
Figure 7B:
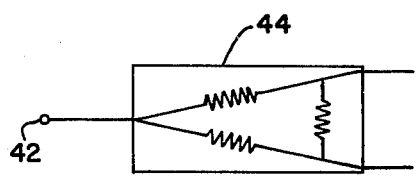

In FIGS. 6A and 6B there is shown the preferred embodiment of the invention. Since a passive circuit is used for inverting and summing the signals, the resulting timing pulse is free of the noise which is ordinarily introduced by active electronic devices. Further the circuitry of FIG. 6A is not as limited by dynamic range considerations as active electronic devices. Finally the high-frequency bandwidth can be extended to frequencies well in excess of 350 MHz by careful material selection and construction techniques.

As here embodied an input signal 40 is applied to the input terminal 42. The signal 40 is acted upon by signal splitter 44, which for instance can be a resistance Δ or Y network, to provide first and second component signals. An attenuator 46, which typically can comprise a resistive ladder circuit, is connected to an output of the splitter 44 and acts along with resistor 56 and the impedance reflected back through the differential transformer 54 to attenuate the first component signal. This attenuation operates to reduce the amplitude of the signal by some constant fraction f. The attenuated signal is indicated by signal 48 at terminal 62.

A delay line 50, which typically can be a coaxial cable, is connected to a second output of the signal splitter 44. The delay line 50 operates on the second component signal to delay that signal by some time $t_d$. The delayed signal is represented at 52.

It is preferred that the respective attenuated signal 48 and signal 52 be applied to terminals 62 and 64 respectively of a constant-fraction differential transformer 54. Signal 52 is applied to terminal 64 through resistor 58 which can take on any value necessary to match the characteristic impedance of delay line 50. A plurality of terminals 60 from the constant-fraction differential transformer 54 allows for a plurality of bipolar output signals, $O/P_1$ to $O/P_n$.

A more detailed showing of the constant-fraction differential transformer is shown in FIG. 6B. The input terminals 62 and 64 to the constant-fraction differential transformer 54 are the same as shown in FIG. 6A. Preferably the differential transformer 54 has the first terminal 62 connected to attenuator 46 through resistance 56 and the second terminal 64 is connected to the delay line 50 through resistance 58. The attenuated signal 48 is applied to a first primary winding 66 having turns $N_{i1}$. The attenuated signal 52 is applied to a second primary winding 68 having turns $N_{i2}$ which is wound opposite to winding 66 as indicated by the dots which identify corresponding ends of the two windings. The primary windings 66 and 68 have a common reference 70 but are wound to have opposite polarity with respect one to the other. As a consequence signal 52, delayed by 50, is inverted respective to signal 48 and then is summed with signal 48 by action of the differential transformer 54. The signal on the secondary winding 72 having $N_{o1}$ turns is proportional to the summation of pulse 48 and inverted pulse 52.

As here embodied a plurality of secondary windings $O/P_1$ to $O/P_n$ provide a plurality of constant-fraction bipolar timing signals. Constant-fraction bipolar timing signals are also available at terminals 62 and 64, making the use of separate secondary windings, shown as 72 and 74, optional.

What is claimed is:

1. An electronic circuit for generating a constant-fraction bipolar output signal related in time to the occurrence of an event identified with an input trigger signal, comprising:

input circuit means for splitting said input trigger signal into a first and second component;

first means connected to said input circuit means for attenuating the first component of said input trigger signal;

second means connected to said input circuit means for delaying the second component of said input trigger signal;

passive means having first and second terminals connected to said respective first and second means for inverting said second component and summing the first component with the second inverted component of said input signal applied thereto and generating a constant-fraction bipolar timing signal at the output of said passive means, said timing signal being accurately correlated with the time of occurrence of said event regardless of the shape and amplitude of the input signal, said passive means including a differential transformer having first and second primary windings respectively connected to said first and second terminals of said passive means and said first primary winding being wound to have opposite polarity relative to said second primary winding.

2. The electronic circuit of claim 1 wherein said differential transformer has a plurality of secondary windings for output of a plurality of constant-fraction bipolar timing signals.

3. An electronic circuit for generating a constant-fraction bipolar output signal related in time to the occurrence of an event identified with an input trigger signal, comprising:

input circuit means to which the input trigger signal is applied for splitting said input signal into a first and a second component;

a differential transformer including a first and a second primary winding, said first winding being wound to have opposite polarity relative to said second winding, and a secondary winding;

first means connected between said input circuit means and said first primary winding of said differential transformer for attenuating the first component of said input signal;

second means connected between said input circuit means and said second primary winding of said differential transformer for delaying the second component of said input trigger signal;

said differential transformer operative to sum the respective signal components applied to the first and second primary windings to generate a constant-fraction bipolar timing signal across said secondary winding, said timing signal being accurately correlated with the time of occurrence of said event regardless of the shape and amplitude of the input signal.

4. The electronic circuit of claim 3 wherein said input circuit means includes a resistive Y network.

5. The electronic circuit of claim 3 in which the input circuit means is a resistive $\Delta$ network.

* * * * *